United States Patent [19]

Pettis

[11] Patent Number: 4,630,211
[45] Date of Patent: Dec. 16, 1986

[54] WATT-HOUR METER DISPLAY FOR INFORMING CONSUMER OF ENERGY CONSUMPTION

[76] Inventor: Charles D. Pettis, P.O. Box 23, Batesville, Tex. 78829

[21] Appl. No.: 602,696

[22] Filed: Apr. 23, 1984

[51] Int. Cl.[4] .................... G01R 19/00; G01R 21/133
[52] U.S. Cl. .................................. 364/464; 364/483; 324/113
[58] Field of Search ............. 364/464, 483, 569, 200, 364/900; 73/861.02, 861.03; 324/57 R, 113, 116

[56] References Cited

U.S. PATENT DOCUMENTS

| | | | |
|---|---|---|---|
| 4,076,554 | 2/1978 | Weihe | 134/60 X |
| 4,080,568 | 3/1978 | Funk | 364/464 X |
| 4,106,095 | 8/1978 | Yarbrough | 364/464 |
| 4,120,031 | 10/1978 | Kincheloe et al. | 364/464 |
| 4,204,115 | 5/1980 | Boldridge, Jr. | 324/175 X |
| 4,207,557 | 6/1980 | Gilkeson et al. | 324/116 X |
| 4,233,590 | 11/1980 | Gilkeson et al. | 324/116 X |
| 4,253,151 | 2/1981 | Bouve | 364/483 |
| 4,261,037 | 4/1981 | Hicks | 364/464 |
| 4,301,508 | 11/1981 | Anderson et al. | 364/483 |
| 4,334,275 | 6/1982 | Levine | 364/551 |
| 4,399,510 | 8/1983 | Hicks | 364/464 |
| 4,442,492 | 4/1984 | Karlsson et al. | 364/464 |
| 4,465,970 | 8/1984 | Di Massimo et al. | 364/483 X |
| 4,489,384 | 12/1984 | Hurley et al. | 364/483 |

FOREIGN PATENT DOCUMENTS 2095877 10/1982 United Kingdom ................ 364/464

OTHER PUBLICATIONS

Hicks, "System for Monitoring Utility Usage", WO82/03482, Oct. 14, 1982.

Primary Examiner—Errol A. Krass
Assistant Examiner—Joseph L. Dixon
Attorney, Agent, or Firm—John T. Matlago

[57] ABSTRACT

The circular array of 200 equally angularly spaced marks about the surface of the rotating calibration disk of a watt-hour meter is optically sensed to provide a series of meter pulses indicative of the rate at which power is being consumed. Each meter pulse corresponds to 1/200 of the amount of the watts rating of the watt-hour meter as represented by one revolution of its disk. These small wattage meter pulses are converted into high frequency pulses and applied onto the household a.c. supply lines. A portable display unit plugged into any outlet of the a.c. supply lines is tuned to receive the high frequency pulses and feed them as digital meter pulses to a single chip microprocessor. The microprocessor operates to count the number of meter pulses received during each 5 second period, as defined by counting real time pulses, and determines therefrom the increments of watts which is used to calculate the data to be displayed indicative of the current cost and the current cost per hour of the energy being consumed.

In order to provide for displaying the cost and watts per hour of energy being consumed for a special use, such as a particular appliance, the basic load on the a.c. supply lines is first stabilized and the increment of watts for a 5 second period thereof determined. Then, starting with the first 5 second period after the appliance has been turned on, the increment of watts for the stabilized basic load is subtracted from the increment of watts for the total load on the a.c. supply lines to obtain the increment of watts for the special use which is then used to calculate the data to be displayed.

10 Claims, 8 Drawing Figures

FIG.4
Binary Strapping for Meter Type
| Inlet Ports 6 | 7 | 8 | 9 | Meter Type |
|---|---|---|---|---|
| 0 | 0 | 0 | 0 | 1.8W |
| 1 | 0 | 0 | 0 | 3.6W |
| 0 | 1 | 0 | 0 | 7.2W |
| 1 | 1 | 0 | 0 | 12.0W |
| 0 | 0 | 1 | 0 | 14.4W |
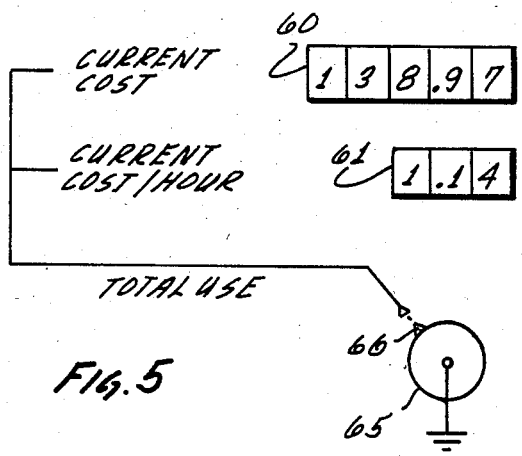
FIG.5
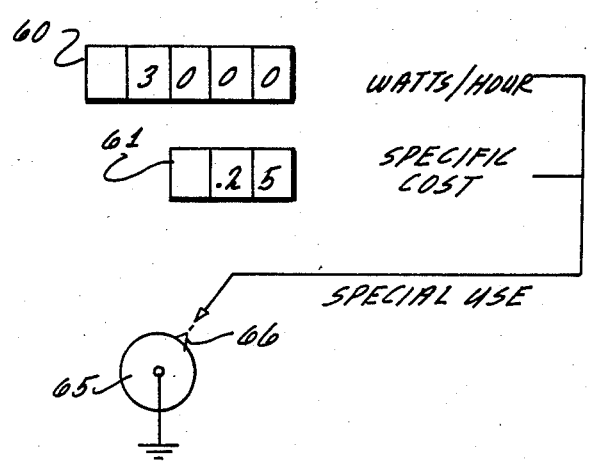
FIG.6

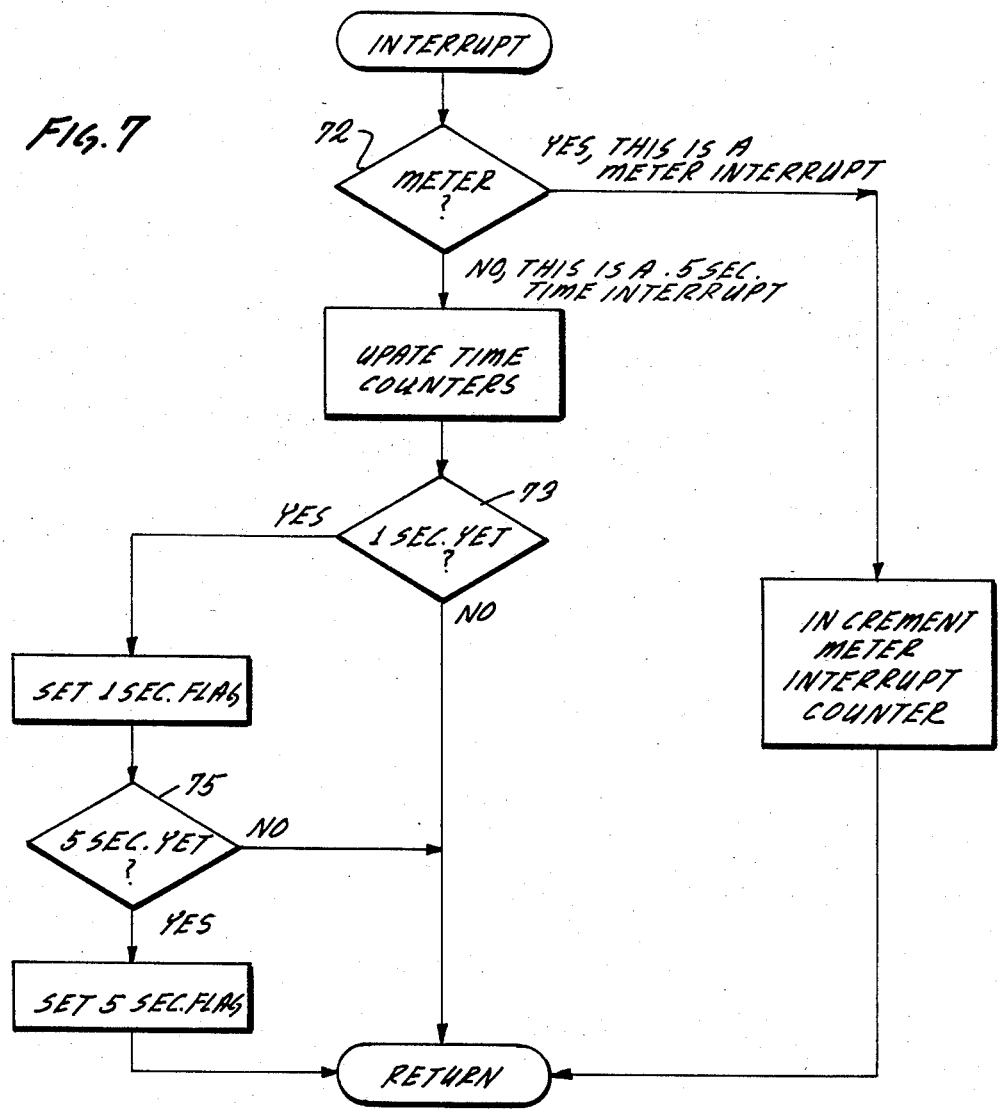

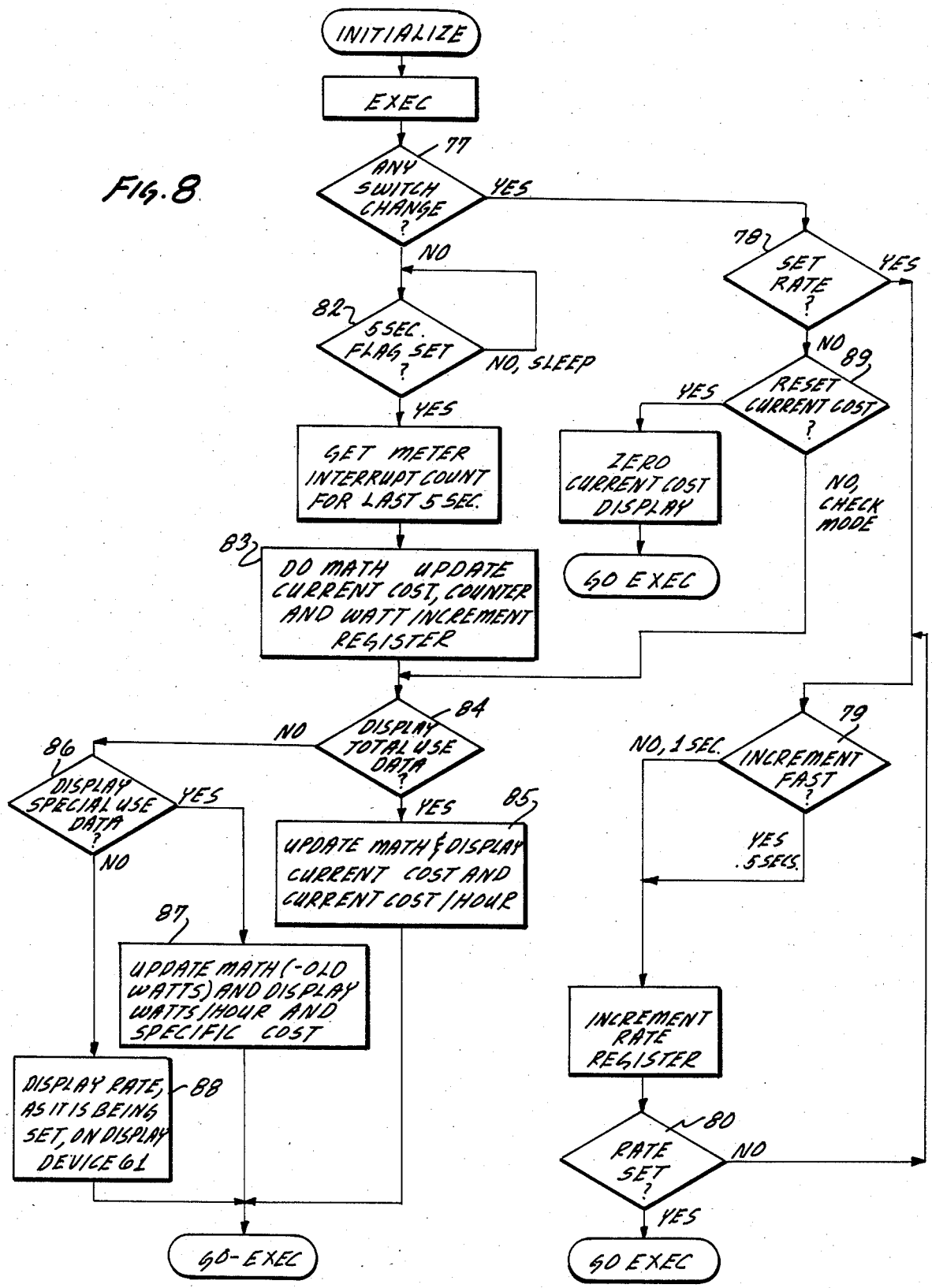

WATT-HOUR METER DISPLAY FOR INFORMING CONSUMER OF ENERGY CONSUMPTION

BACKGROUND OF THE INVENTION

This invention relates to electric meters and more particularly to apparatus and circuits associated with a watt-hour meter for displaying data relating to electrical energy usage in the home of a consumer.

In view of the high cost of electrical energy, there is a need for letting a home consumer immediately know the cost of his current electrical bill as the electrical energy is being consumed and also the current cost per hour at which the energy is being consumed so that he can take steps to reduce the usage or otherwise conserve as he desires.

Prior art patents related to the subject matter of this invention include U.S. Pat. No. 4,204,115 which discloses an opto-sensor for sensing the rotation of a watt-hour meter calibrating disk having a single indicator mark on its periphery. Each time the indicator mark is sensed, a pulse is provided representative of the rate at which the power is being consumed. Later art, such as U.S. Pat. No. 4,399,510, discloses how such a pulse sensed each rotation of the warr-hour meter disk can be applied as a high frequency pulse on the household a.c. supply lines and sensed therefrom for feeding to a microprocessor for counting and conversion to cost parameters which are then projected and compared with a maximum budgeted amount for monitoring purposes.

It should be particularly noted, however, that these prior art patents do not provide for displaying data which lets a consumer immediately know, as the energy is being used, not only what the cost is for the current billing period but also the current cost per hour of the energy being consumed. Moreover, these prior art patents do not provide a simple and inexpensive means for displaying data which lets a consumer known how much it costs to dry a load of clothes, for example, or how much electrical energy is being used each evening, say, from 6 p.m. till bedtime. The ability to display such data is important inasmuch as it enables a consumer to determine if he is conserving.

Thus, in a system wherein a single pulse is provided each revolution of a watt-hour meter disk, and especially when the power is being consumed at a relatively low rate, it takes such a long time before an incremental change in power, as represented by the pulse, is sensed, that it is impossible for the consumer to be kept currently informed as to what the situation is as far as power usage is concerned.

BRIEF DESCRIPTION OF THE INVENTION

In the preferred embodiment of the present invention, the circular array of 200 equally angularly spaced marks that is normally provided on the surface of the rotating disk of a watt-hour meter for calibration purposes, is sensed by an optosensor to provide a series of pulses. Each pulse corresponds to 1/200 of the value of the watts rating for a home watt-hour meter as represented by one rotation of its disk, which typically may be 1.8 watts, 3.6 watts, 7.2 watts, 12.0 watts, etc. These small wattage meter pulses, each equal to 0.060 watts in a 12.0 watts rated meter, for example, are converted by a 90 KHz transmitter enclosed within the glass cover of the meter into high frequency pulses and applied onto the household a.c. supply lines. A portable display unit that can be plugged into any outlet of the household a.c. supply lines includes a 90 KHz receiver tuned to receive the high frequency pulses and feed them as digital meter pulses to a single chip microprocessor. The microprocessor operates to count the number of meter pulses received each 5 second period, as determined by a real time counter, performs math on the meter pulse count, and continuously displays data on display devices indicative of the current cost and the current cost per hour of the energy consumed. It should be especially noted that the display of the current cost per hour of the energy consumed based on the meter pulse count each 5 second period enables the consumer to be practically instantaneously made aware of any changes that occur in the rate of power consumption.

In accordance with another feature of the present invention, when it is desired to provide for displaying the cost and watts per hour of energy being consumed for a special use, such as the operating of a particular appliance, for example, the total load on the household a.c. supply lines is first stabilized. Then, upon first setting a display selector on the portable display unit to display such special data and, thereafter, turning on the particular appliance, such as a clothes dryer, the increment of watts corresponding to the stabilized basic consumption, as calculated by use of the meter pulses received in a 5 second period prior to turning on the clothes dryer, is stored in a separate register. Then, starting with the first 5 second period that the meter pulses are counted after the clothes dryer is turned on, the increment of watts corresponding to the stabilized basic consumption is subtracted from the increment of watts of the total load on the household a.c. supply lines to obtain the increment of watts for the special use. Thus, the results of the math each 5 second period only indicate the watts per hour and the incremental specific cost for operating the clothes dryer, and the microprocessor provides for updating the display of the watts per hour and accumulated specific cost on the display device each 5 second period.

Accordingly, one of the objects of the present invention is to provide for measurement of power usage in such small increments and over such small fixed periods of time that practically instantaneously readings relating to electrical energy consumption and costs thereof can be calculated and displayed even when the consumption is very low.

Another object of the present invention is to provide an inexpensive means and method of displaying data which practically instantaneously shows a consumer how fast power is being consumed in the home.

Another object of the present invention is to provide a display associated with a household watt-hour meter that shows practically instantaneously readings of the watts per hour usage of electrical energy in the home.

Another object of the present invention is to calculate the cost per hour of electrical energy being consumed in the home based on the power consumption for a 5 second period.

Another object of the present invention is to provide a simple means and method for displaying data for informing a consumer how much it costs to operate a particular electrical appliance as it is normally being used in the home.

Another object of the present invention is to calculate the watts per hour of electrical energy being consumed in the home for a particular appliance based on the power comsumption for a 5 second period.

Still another object of the present invention is to provide a portable display unit for use in sensing power increments provided by a circular array of marks on the surface of a disk of a watt-hour meter wherein the microprocessor for the display unit can be readily adapted for use with a number of different meter types each having a different watts rating.

Other objects and attendant advantages will be appreciated by those skilled in the art as the invention becomes better understood by reference to the following description when considered in connection with the accompanying drawings.

BRIEF DESCRIPTION OF THE DRAWINGS

FIG. 4 is a table indicating the strapping of the inlet ports of the microprocessor for different meter types;

FIG. 5 shows the data being displayed on the display devices when the display selector is switched to total use;

FIG. 6 shows the data being displayed on the display devices when the display selector is switched to special use;

FIG. 7 is a flow chart of the interrupt service loop routine provided by software for operating the microprocessor to perform the time and meter pulse counting functions; and FIG. 8 is a flow chart of the overall math and display routines provided by software for operating the microprocessor to perform math on the time and meter pulse counts and to display the results.

DESCRIPTION OF THE PREFERRED EMBODIMENT

Figure 1:
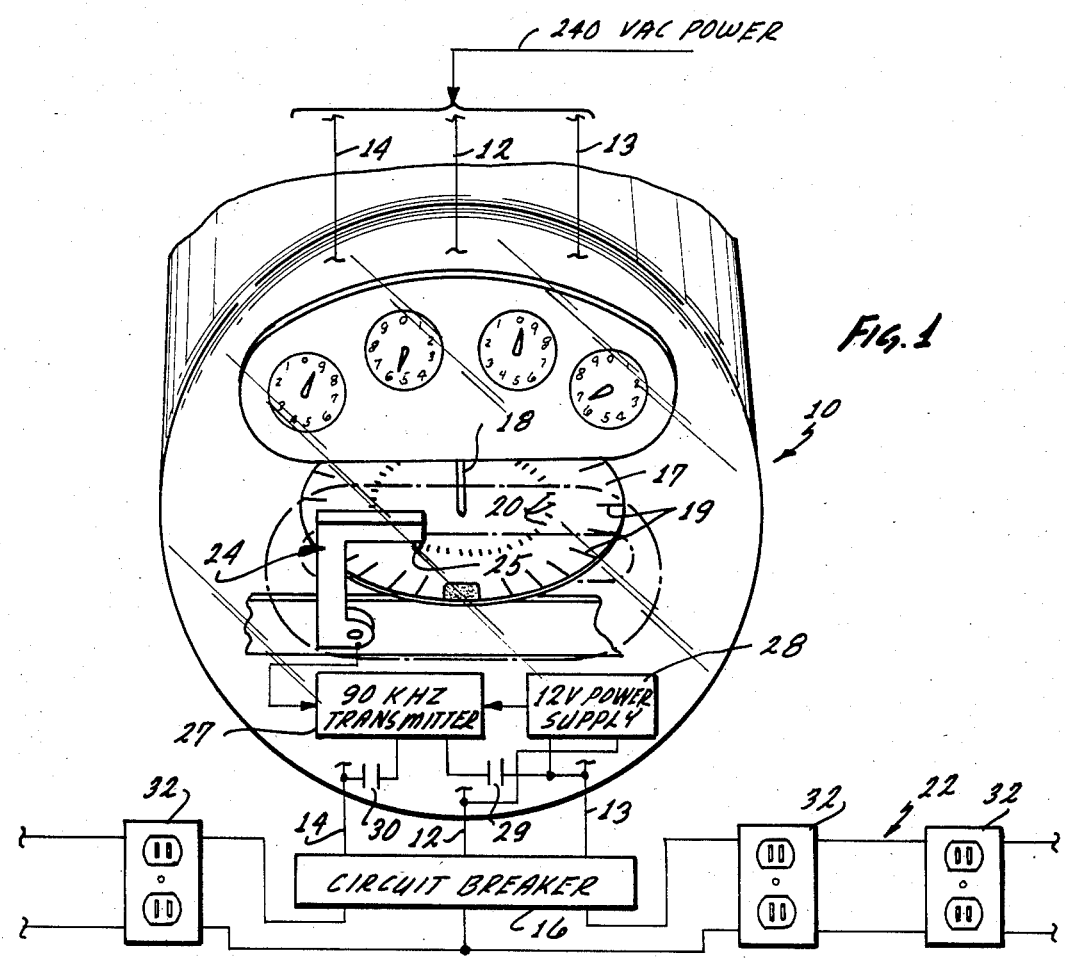
FIG. 1 is a schematic diagram of a typical watthour meter and associated apparatus and circuits which provide for applying high frequency pulses indicative of small increments of power onto the household a.c. supply lines.

Turning to the drawings, reference will first be made to FIG. 1 which diagrammatically illustrate a conventional watt-hour meter 10 together with apparatus and circuitry provided within the glass enclosure thereof, in accordance with the present invention, for enabling high frequency meter pulses corresponding to small incremental changes in power to be applied on the household a.c. supply lines 22.

Thus, the meter 10 is connected to receive a three line 240 VAC power feeder comprising a neutral line 12, a phase 1 line 13 and a phase 2 line 14. The three lines coming out of the meter 10 connect to a circuit breaker 16, and then the neutral line 12 and the phase 1 line 13 form one 120 volts a.c. branch and the neutral line 12 and the phase 2 line 14 form another 120 volts a.c. branch of the household a.c. supply lines. The meter 10 is conventionally provided with a rotor which includes a disk 17 mounted on a vertical shaft 18. At the time the meter 10 is manufactured, the disk 17, which is made of aluminum, is provided with an outer circular array of 100 equally spaced black paint marks 19 and an inner circular array of 200 equally spaced black paint marks 20. These circular arrays of black paint marks on the disk are normally used for calibrating the meter.

Enclosed within the glass enclosure of meter 10 is an optoelectronic infra-red source/sensor 24 contained in a single package such as the HEDS 1000 unit manufactured by Hewlett Packard. In the present embodiment, the sensor 25 of the source/sensor 24 is positioned to sense the inner circular array of 200 equally spaced marks 20 on the rotating disk 17. Thus, as the disk 17 rotates, the source of infra-red radiation in source/sensor 24 illuminates the upper surface thereof and most of the radiation is reflected back into the sensor 25. However, each time a black mark 20 appears, the reflected radiation is substantially reduced and the change is detected as a signal. Suitable TTL circuitry (not shown) shapes the signal and provides an input to a 90 KHz transmitter 27. The 90 KHz transmitter 27 together with its 12 v. power supply 28 is a conventional unit commonly used in the industry for signalling purposes and is adjustable over a fairly broad range of frequencies in order to obtain a clear channel so as not to interfere with or be interferred by other systems which may be present on the household a.c. supply lines.

Thus, each time a black mark 20 is sensed by the source/sensor 24 on the rotating disk 17, the 90 KHz transmitter 27 is turned on for a predetermined one-shot time of approximately 1 millisecond to generate a high frequency meter pulse on the two outputs thereof, one of which is connected by a coupling capacitor 29 to the phase 1 household line 13 and the other of which is connected by a coupling capacitor 30 to the phase 2 household line 14. This ensures that the outlets 32 provided in both the phase branches of the household 120 volt a.c. lines 22 will have the high frequency meter pulses available thereon.

Figure 2:
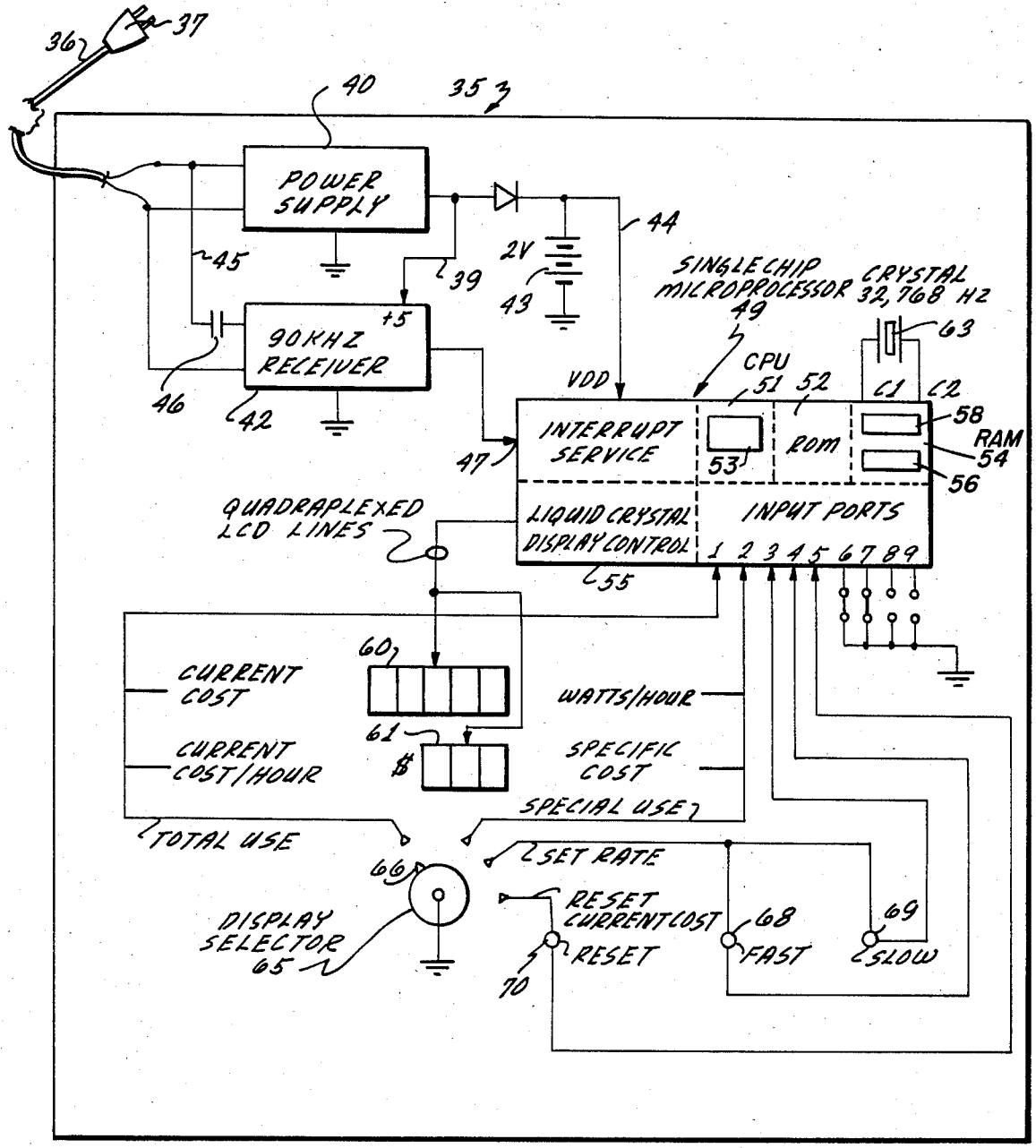
FIG. 2 is a schematic block diagram of a portable display unit capable of being plugged into any outlet provided in the household a.c. supply lines.

Reference will next be made to FIG. 2 which diagrammatically illustrates a portable consumer display unit 35. This display unit 35 is provided with an electric cord 36 having on the end thereof an attachment plug 37 which can be inserted into any a.c. outlet 32 on the household a.c. supply lines 22. The cord 36 thus feeds the a.c. supply into the box 38 (FIG. 3) enclosing the display unit 35 and connects to a conventional power supply 40 which supplies d.c. on line 39 for operating a 90 KHz Phase Locked Loop (PLL) receiver 42 and also supplies d.c. on line 44 for operating a single chip microprocessor 49. The 90 KHz PLL receiver 42, which is a conventional consumer product type signalling receiver, also connects by line 45 to the a.c. supply lines 22 through a coupling capacitor 46 and has its frequency tuned so as to sense the high frequency meter pulses carried thereon. The output of the 90 KHz PLL receiver 42 supplies digital meter pulses to the external interrupt input 47 of the microprocessor 49. When a digital meter pulse is received at the external interrupt input 47, any processing function that may be going on in the microprocessor 49 is interrupted in midstream, the interrupt is serviced, and then the normal processing function is restored. Hereinafter the receipt of a digital meter pulse at the input of the external interrupt input 47 is referred to as a "meter interrupt".

The single chip microprocessor 49 is a 7502 unit manufactured by NEC. It includes a central processing unit (CPU) 51, a read only memory (ROM) 52 for storing software and other fixed data, a random access memory (RAM) 54 for facilitating the storage and retrieval of data, and input ports 1 to 9, inclusive.

The microprocessor 49 is provided with a meter type strapping arrangement on its inlet ports 6, 7, 8 and 9. These inlet ports are scanned during the math routines of the microprocessor 49 and the binary code represented by the strapping of selected ones of these inlet ports to ground corresponds to a meter type. Typically, the 1.8 watt meter is the smallest meter available. However, there are quite a few meter types that are currently installed in the home, the most popular being shown in the table in FIG. 4. In any case, the wattage constant (amount of wattage corresponding to a single revolution of the meter disk) of a number of different manufacturer's meter types are put into the RAM 54. The strapping then indicates to the microprocessor 49 what the wattage constant should be for the meter being used in a particular installation. In the math, 1/200 of the value of the watts represented by each rotation of the disk within the meter is the value of the meter pulse or "meter interrupt". Thus, the utilization of straps on the 6 and 7 inlet ports, indicated in the table of FIG. 4 by the binary code 1100, i.e., wherein only the inlet ports 6 and 7 are grounded, indicates to the microprocessor 49 when performing math that a 12.0 watt meter type is being used and that each meter interrupt is equal to 0.060 watts.

Figure 3:
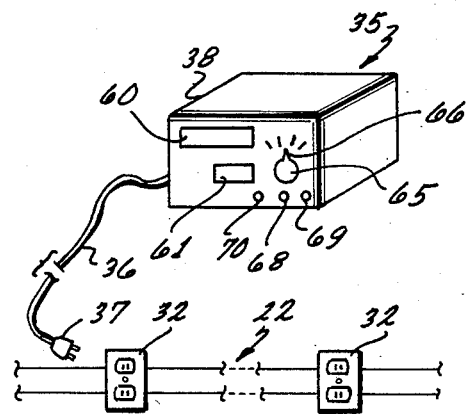
FIG. 3 is a perspective view of the box used to enclose the display unit with the display devices and the display selector provided on the front panel thereof.

As shown in FIG. 3, mounted on the front panel of the box 38 for the display unit 35 are two liquid crystal display devices, a 5-digit display device 60 and a 3-digit display device 61. Also provided on the front panel of the box 38 is a display selector 65 having a pointer 66 capable of being switched to provide four different settings or connections to the inlet ports 1, 2, 3, 4 and 5 of the microprocessor 49. Thus, as illustrated in FIG. 2, a TOTAL USE setting provides an input to inlet port 1; a SPECIAL USE setting provides an input to inlet port 2; a SET RATE setting, dependent on the manual depressing of a FAST push button 68 or a SLOW push button 69, provides an input to inlet ports 3 or 4; and a RESET CURRENT COST setting, dependent on the manual depressing of the RESET push button 70, provides an input to inlet port 5.

It should now be clearly understood that the microprocessor 49, in addition to responding to the straps on its input ports 6, 7, 8 and 9 to select the value of the meter interrupt for the type of meter being used, i.e., 1.8 w, 3.6 w, 7.2 w, 12.0 w, etc., also accepts inputs from push buttons 68 and 69 to set the proper rate or cost per killowatt, accepts an input from push botton 70 to zero the current cost display at the end of the billing period, and responds to the display selector 65 to change the data to be displayed on the display devices 60 and 61.

The liquid crystal 5-digit display device 60 and 3-digit display device 61 each have a built-in hardware quadraplex function. The only thing software has to do is load specified register locations within the RAM 54 of the microprocessor 49 with the data to be quadraplexed and hardware provided by the liquid crystal display control block 55 in the microprocessor does the balance. This technique is well known in the hand calculator industry, such as the NEC 7502 processor.

Within the box 38 used for enclosing the apparatus for the display unit 35, a 32,768 Hz crystal 63 is provided and connected to terminals C1 and C2 of the microprocessor 49 to control a hardware clock (not shown) therein. Software only loads a modulo counter which operates to provide 0.5 second time digital pulses which are applied to the "internal" interrupt input (not shown) of the microprocessor 49. The crystal 63 is a common wristwatch crystal and since the time base of operation is only 5 seconds it is quite accurate enough.

The inlet ports 1, 2, 3, 4 and 5 are scanned in the EXEC loop of the software (FIG. 8) to detect any change in the setting of the display selector 65 from its previous setting. The software then looks at these inlet ports to determine whether the TOTAL USE setting has been selected (inlet port 1) of the SPECIAL USE setting has been selected (inlet port 2) by the display selector 65. Finding that neither the TOTAL USE or SPECIAL USE setting has been selected, the program knows that either the SET RATE setting (inlet ports 3 and 4) or the RESET CURRENT COST setting (inlet port 5) has been selected by the display selector 65. If the SET RATE setting has been selected, when either the FAST push button 68 or the SLOW push button 69 is manually depressed the program performs a SET RATE function. If the RESET CURRENT COST setting has been selected, when the RESET push button 70 is manually depressed the program operates to reset the CURRENT COST register in the RAM 54 to zero.

When the display selector 65 is changed back to either the TOTAL USE setting or the SPECIAL USE setting, the decision is made to display data associated with one or the other of these settings on the display devices 60 and 61.

The display devices 60 and 61 show two different types of data. As shown in FIG. 5, when the display selector 65 is pointing to TOTAL USE, the accumulated current cost of energy for the billing period, e.g. $138.97, is displayed on the 5-digit display device 60; and the current cost per hour of the energy, e.g. $1.14, is displayed on the 3-digit display device 61. As shown in FIG. 6, when the display selector 65 is pointing to SPECIAL USE, so as to obtain data relating to a particular appliance, such as a clothes dryer, for example, the watts per hour usage, e.g. 3000, is displayed on the 5-digit display device 60; and the accumulated specific cost of the energy for the use of that appliance for a given period, i.e., the total cost of drying a load of clothes, e.g. $0.25, is displayed on the 3-digit display device 61.

Reference will next be made to the flow chart in FIG. 7 which describes the "Interrupt" Service Routine. This routine is carried out in the microprocessor 49 each time an external "meter interrupt" occurs or an internal "time interrupt" occurs. Thus, when one of these two interrupts occurs a test is made in step 72 to determine whether it is a meter interrupt or a time interrupt.

If the interrupt is a meter interrupt, the program enters a very short loop that simply increments a counter 56, a register in RAM 54, as shown in FIG. 2, which counts the meter interrupts for each 5 second period. Each of the meter interrupts is equal to 1/200 of the meter type selected by the straps on the input ports 6, 7, 8 and 9. Since in the preferred embodiment the meter type used is a 12.0 watt meter 10, each meter interrupt has a value of 0.060 watts. This loop is very short and can be entered and serviced in less than 100 microseconds. The software then returns to the program that was interrupted.

If the interrupt is a time interrupt, the software flow proceeds to increment a counter, a register in RAM 54, which counts the 0.5 second time interrupts. In step 73, a test is made to determine if 1 second has been counted. If 1 second has not been counted, the software returns to the part of the program that has been interrupted. If 1 second has been counted a 1 second flag is set. Besides the 1 second counter, the software provides for a 5 second counter 58, as shown in FIG. 2, to be incremented by the 0.5 second time interrupts. This latter counter is the time base, or sampling interval, used in the microprocessor operations. Thus, in step 75 a test is made to determine if 5 seconds has been counted. If 5 seconds has not been counted, the software returns to the program that has been interrupted. If 5 seconds has been counted a 5 second flag is set indicating to other parts of the program that it is time to do math by use of arithmetic logic curcuits 53 included in CPU 51 on the meter interrupts counted during the last 5 second period, update the display devices, etc. In either case, the routine returns to part of the program that was interrupted.

Reference will next be made to the flow chart in FIG. 8 to explain the software flow and interaction of the microprocessor 49 to outside functions. Basically, the software provides processor functions of resetting of the rate, resetting of the current cost register to zero, mode switching, sensing of the 1 second and 5 second time bases for various functions, utilizing a "sleep" routine to reduce the power consumed, performing math on the meter interrupt counts, and storing the display values.

Thus, as shown in FIG. 8, the overall flow chart starts off with an initializing action which when power is first applied clears the memory locations in RAM 54 used for the storage of various functions, the storage of data for updating the display devices, the storage of the general purpose registers used for performing math, and the storage of the flag settings. This only occurs during initial start up and would only reoccur if power were removed for an extended period and memory were lost requiring a resetting of the rate.

The EXEC block is a return point from which all routines return to. It is the "idle" loop which waits for a routine to be required.

Following the EXEC block, in step 77, the program looks for any switch change in the display selector 65 and finding that neither the TOTAL USE or SPECIAL USE setting has been selected would normally go out and check the SET RATE setting in step 78. Finding the SET RATE setting has been selected, it then tests in step 79 for the FAST or SLOW push buttons 68 or 69 to be manually pressed. If the FAST push button 68 is manually pressed, then a rate register in RAM 54 increments a tenth of a cent each 0.5 second time signal up toward the desired rate. Upon approaching the proper rate, the SLOW push button 69 is then manually pressed and the rate register increments a tenth of a cent each 1 second time signal toward the desired rate. This rate, as it is being incremented in the rate register, is displayed on the 3-digit display device 61 to let the operator know when the proper rate has been set in the rate register. The displaying of this rate is indicated by the display block 88 in the flow chart of FIG. 8.

After the SET RATE function has been carried out, the program performs a test in step 80 to see if the SET RATE setting has been moved back to either the TOTAL USE or SPECIAL USE setting. If so, the EXEC block is reentered with the proper rate set in the rate register located in RAM 54.

It should be noted that there is one other loop in FIG. 8, that is, when the display selector 65 has been set to RESET CURRENT COST. Thus, when the EXEC block is left to service a switch change this setting is recognized in step 89. Thus, upon the manual depressing of the RESET push button 70 the CURRENT COST register in RAM 54 used for accumulating the incremental costs for the billing period charges is zeroed. This is manually done once at the end of the billing period.

With the rate setting having been taken care of, the program proceeds from the EXEC block to step 82 to test whether the 5 second flag is set. If the 5 second flag has not been set the program switches to "sleep". "Sleep" is the mode where a special instruction puts the microprocessor 49 into a very low power mode of about 20 microamps in between time and meter interrupts as compared to the normal power mode of 200 microamps. The "sleep" feature thus greatly reduces power consumption when the processor is not busy. So, while in the "sleep" state, the time counter is being updated by the 0.5 second time interrupts as they are received and the meter interrupt counter is being updated by the meter interrupts as they are received.

It should be noted that the "sleep" feature allows a 2 volt battery 43 (FIG. 2) to provide sufficient power to hold the data stored in RAM 54 during short power failures and does away with the necessity of resetting the rate therein whenever they occur. Thus, the battery 43 will typically run the microprocessor 49 "sleep" circuits for 8 to 9 hours of failed power.

When it is determined in step 82 that the 5 second flag is set the program branches down and transfers the contents of the meter interrupt counter 56 corresponding to the number of interrupts that were received during the last 5 second period to a register in RAM 54 used for math and simultaneously zeros the meter interrupt counter 56 which is another register in RAM. The program then enters the math routines carried out in block 83 which use the count of the meter interrupts in the last 5 seconds to calculate the increment of watts it represents and stores this increment of watts in a register of RAM for further use. The program in block 83 also provides for computing from this increment of watts the incremental cost of the power used in the household during the last 5 second period and updates the accumulated cost in the current cost counter. It should be especially noted that all computations are made using the meter interrupts counted each 5 second period.

Before further discussing the math routines, it should be noted that there are two basic math formulas that are used in the microprocessor 49 to generate the data to be displayed on display devices 60 and 61 during TOTAL USE and SPECIAL USE. Both of these math formulas draw on built-in math routines of ADD, SUBTRACT, MULTIPLY and DIVIDE stored in ROM 52.

The first math formula which provides for calculating the incrmental cost of the electrical energy on the household a.c. supply lines 22 for the last 5 second period and accumulating the cost to date is as follows:

$$\frac{\text{No. Meter Interrupts Last 5 sec.} \times \frac{(12.0 \text{ w})}{200}}{1000} \times$$

Rate per KW + OLD COST = CURRENT COST

Thus, as indicated by the above formula, the total number of meter interrupts received during each 5 second period is multiplied by 0.060 watts per meter interrupt (12.0 watt meter type divided by 200) to obtain the increment of watts, divided by 1000 to convert to kilowatts, and multiplied by the rate per KW (e.g. 10 cents) to obtain the incremental cost of the energy used during that 5 second period. This incremental cost is then added to the cost so far accumulated (old cost) to obtain the current cost. It should be appreciated that because of the measurement of power in such small increments the increase in the cost showing of the current cost is, at the most, on the order of hundredths of a penny each 5 second period.

From the above formula it is evident that the increment of the watts in the last 5 second period is determined as follows:

$$\text{No. Meter Interrupts Last 5 sec.} \times \frac{\text{Meter Type}}{200} = \text{Increment of watts/5 sec. period}$$

This increment of watts, as calculated in block 83, is stored in a register of RAM for later use.

The next decision process in the flow chart of FIG. 8 is carried on in step 84 to determine whether the display selector 65 has been set to TOTAL USE or SPECIAL USE. If the display selector has been set to TOTAL USE the math is further carried out in block 85 on the increment of watts calculated in block 83 using a second math formula. This second math formula is as follows:

$$\frac{\text{No. Meter Interrupts Last 5 sec.} \times \frac{\text{Meter Type}}{200} \times 720 \text{ (5 sec. periods/hour)}}{1000} \times \text{Rate per KW} = \text{CURRENT COST/HOUR}$$

Thus, as indicated by the above formula, when the increment of watts as determined in block 83 is multiplied by 720, which is the number of 5 second periods in an hour, divided by 1000 to convert to kilowatts, and multiplied by the rate per KW, the CURRENT COST/HOUR is obtained.

Having completed the math for TOTAL USE data, in block 85, the CURRENT COST, as previously calculated and stored in block 83, is then displayed on the 5-digit display device 60 and the CURRENT COST/HOUR, as calculated in block 85, is displayed on the 3-digit display device 61.

If as a result of the test in step 84 it is determined that the display selector 65 has not been set to TOTAL USE, instead of proceeding to block 85 to update the math and display the TOTAL USE data, a test is made in step 86 to determine if the display selector 65 has been set to SPECIAL USE. If the display selector has not been set to SPECIAL USE, this indicates that SET RATE is being performed, as previously described. If SPECIAL USE has been set, the program proceeds to block 87 which provides for updating the math using as old watts the increment of watts as calculated and stored in block 83.

The math up-date provided in block 87 to obtain the data to be displayed for SPECIAL USE generally uses the same two basic formulas described above for calculating the data for TOTAL USE with a few modifications.

The most important modification in SPECIAL USE is that it only provides data for the load on a particular appliance, for example.

Thus, in order to conduct a test on a particular appliance, the consumer first makes sure that the basic consumption of power being used in the household has been stabilized, i.e., that no changes of any significance are expected in the basic consumption during the period of the test. Only then is the display selector 65 switched to the SPECIAL USE setting. This action causes the WATTS/HOUR and SPECIFIC COST registers to be reset to zero. Then, when an appliance, such as a clothes dryer, is turned on for a test, starting with the first 5 second period, the old increment of watts previously stored in a register in RAM 54 in block 83, and which corresponds to the basic consumption, is subtracted from the increment of watts as calculated for each 5 second period, leaving only the increment of watts for the specific appliance load for use in math. As long as the basic consumption remains steady the display devices 60 and 61 will only show the WATTS/HOUR and the SPECIFIC COST of that particular appliance. It should be especially noted that the WATTS/HOUR informs the consumer as to how fast he is consuming power.

It should be noted that the WATTS/HOUR is the WH consumption. Thus, the math formula for the WATTS/HOUR data differs from the math formula for the COST/HOUR data in TOTAL USE in that there is no conversion to KWH nor does it use a rate. It only shows WATTS/HOUR on the 5-digit display device 60 to test an appliance tag rating up to 99,999 watts per hour maximum.

It should be further noted that the formula for the CURRENT COST data in the TOTAL USE setting corresponds to the math formula for the SPECIFIC COST data in the SPECIAL USE setting. However, the CURRENT COST is the accumulated cost to date for the total energy usage in the household during a billing period and is displayed on the 5-digit display device 60 whereas the SPECIFIC COST is the accumulated cost so far for the specific appliance load being tested and is displayed on the 3-digit display device 61. In other words, the SPECIFIC COST does not include the cost of the stabilized basic consumption.

It should be especially noted that the CURRENT COST data as provided for TOTAL USE is always computed and accumulated internally even during the SPECIAL USE setting although it is not displayed during that time.

It should now be evident that the SPECIAL USE setting of the display selector 65 provides for the display of accumulated costs for an appliance that only intermittently turns on for short periods of time during its operation. Thus, assume that the appliance to be tested during SPECIAL USE is a refrigerator that only intermittently turns on at the most for a period of 10 minutes every hour. Thus, if the basic consumption on the household a.c. supply lines has been stabilized, and the display selector has been set to SPECIAL USE, upon connecting the cord of the refrigerator to an outlet of the household a.c. supply lines, each time the refrigerator turns on and the total incremental watts on the household a.c. supply lines exceeds the increment of watts of the basic consumption, in a 5 second period, the incremental cost of the electricity for the refrigerator alone will be added to the specific cost so far accumulated since the test was started.

The SPECIAL USE setting of the display selector 65 on display unit 35 can also be used to determine the cost of power usage between 6:00 p.m. and bedtime, for example, by first making sure the power in the household is all off or is at a very low level of basic consumption. Then, upon switching to SPECIAL USE at 6:00 p.m., whenever the power usage during the evening is above the basic consumption, the costs therefore are incrementally calculated and accumulated for display on the 3-digit display device 61. Thus, at bedtime, the SPECIFIC COST data on the 3-digit display device 61 corresponds to the cost of the electrical energy that has been consumed between 6:00 p.m. and bedtime.

It should now be clearly understood that because of the fine resolution of watts usage provided by the present invention, a high degree of accuracy is obtained and the readings concerning the use of electrical energy are updated and displayed in a timely manner.

As an example, suppose the energy usage was yielding only one meter interrupt for each 5 second period. Then, 0.060 watts multiplied by 720 equals 43.2 watts in a one hour period. This is so small it obviously would not show a cost but it affords the advantage of practically instantaneous readings of power consumption changes, i.e., every 5 seconds. That is, the home consumer is practically instantaneously informed of the changes in the current COST/HOUR or the WATTS/HOUR readings, where the latter reading may be as small as 43.2 watts/hour.

As another example, at a 100 watt per hour consumption rate it takes a 12.0 watt meter 432 seconds for its disk 17 to make one revolution. Therefore, other systems using 1 mark per revolution would require 432 seconds to determine if any change had occurred. The present system will provide an immediate (5 seconds) reading of 100 watts per hour because it receives, at 100 watts per hour, 200 meter interrupts every 432 seconds. That is:

$$\frac{100 \text{ watts/hour}}{12.0 \text{ watt meter}} = 8.333 \text{ (disk) revolutions/hour}$$

$$8.333 \text{ rev./hour} \times 200 \text{ marks/rev.} = 1,666 \text{ meter interrupts/hour}$$

$$\frac{1,666 \text{ meter interrupts}}{720 \text{ (5 sec. periods/hour)}} = 2.31 \text{ meter interrupts/5 sec.}$$

Thus, 2.31 meter interrupts×0.060 watts per meter interrupt yields 2.31×0.060 watts=0.139 watts each 5 seconds. Thus, 0.139×720 (5 second periods per hour) is equal to 100 watts per hour.

The apparatus is thus a real time WATTS/HOUR display which can not be made by sensing one mark per revolution of a watt-hour meter. In fact, unless at least the circular arrays of 100 or 200 marks are used on the calibration disk 17 (both are available) or unless another circular array of approximately the same number of marks is provided on the surface of disk 17, it is not practical to even try to display COST/HOUR or WATTS/HOUR. The following example illustrates why this is so.

Suppose the consumption were 10 KW per hour steady for several minutes. Then a system using only 1 mark per disk revolution would be receiving meter interrupts at a rate of one every 4.31 seconds or 100 times faster than in the above 100 watt per hour example. Now if the energy of 10 KW per hour, such as used by an oven and a dryer, is discontinued by turning off these appliances just after the single mark was sensed, and the meter is left with 50 watts per hour of consumption, then it will be 864 seconds (almost 15 minutes) before another meter interrupt comes along at 1 mark per disk revolution. In other words, a WATTS/HOUR display using a 12.0 watt per revolution mark (1 mark per revolution) would falsely show 10 KW's of consumption for almost 15 minutes after the load had dropped back to 50 watts.

In the case of the present invention the following happens: During 10,000 watts per hour consumption, the rotating disk 17 of meter 10 is providing meter interrupts at a rate of about one every 21.3 milliseconds, which is 200 times faster than the 1 mark disk. At such a rate, 235 meter interrupts occur each 5 seconds, but when the 10 KW per hour load goes off in the next 5 seconds, only 1 meter interrupt per second corresponding to the 43 watts per hour of consumption will remain. In other words, the display will go to its least discernable resolution or change of 43 watts per hour. But the important thing is that it does show the change within 5 seconds.

It should be appreciated that although a 5 second period has been used in the preferred embodiment as the time basis for counting the meter interrupts and performing the math to calculate the data to be displayed, other time bases, such as 2 to 10 second periods may be employed.

While the foregoing disclosure has been primarily concerned with a particular exemplary embodiment, it is to be understood that the invention is susceptible of many modifications in construction and arrangement. The present invention, therefore, is not to be considered as limited to the specific disclosure provided herein, but is to be considered as including all modifications and variations coming within the scope of the invention as defined in the appended claims.

What is claimed is:

1. A system for displaying on a real time basis the cost per hour rate of the consumption of electrical energy in a home, said system comprising:

a rotating disk within an electric meter having a circular array of on the order of 200 equally spaced marks thereon, each mark representing a fixed increment of watts;

means for sensing the marks on said rotating disk and applying high frequency electrical signals corresponding to each mark on a.c. supply lines within the home;

means for receiving said high frequency electrical signals from said a.c. supply lines and providing digital meter pulses;

a timing source providing digital time pulses representative of real time;

a microprocessor means including a first counter means for counting said digital meter pulses and a second counter means for counting said digital time pulses to define successive fixed periods of time, each of said fixed periods of time being on the order of 5 seconds in duration;

said microprocessor means including means for multiplying the number of digital meter pulses counted in the first counter means during each of said fixed periods of time on the order of 5 seconds in duration by the increment of watts represented by each mark on the rotating disk, multiplying by the number of said fixed periods of time in an hour, dividing by 1000 to convert to kilowatts, and multiplying by a rate per kilowatt to provide the real time cost per hour rate at which electrical energy is being consumed in the home; and a display means;

said microprocessor means including means for continually updating said display means each of said fixed periods of time to display said real time cost per hour rate.

2. A system for displaying real time data relating to the cost of electrical energy being consumed in a home comprising:

a rotating disk within an electric meter having a circular array of on the order of 200 equally spaced marks thereon, each mark representing a fixed increment of watts;

means for optically sensing the marks on said rotating disk and applying high frequency pulses corresponding to each mark on a.c. supply lines in the home;

means for receiving said high frequency pulses from said a.c. supply lines and providing digital meter pulses;

a timing source providing digital time pulses representative of real time; and a microprocessor means including a first counter means for counting said digital meter pulses and a second counter means for counting said digital time pulses to provide fixed periods of time, each fixed period of time being on the order of 5 seconds in duration;

said microprocessor means including means to perform calculations on a number of digital meter pulses counted by the first counter means each time the second counter means defines a fixed period of time by multiplying said number of digital meter pulses by the increment of watts represented by each digital meter pulse to thereby provide an incremental amount of watts consumed during each said fixed period of time, dividing said incremental amount of watts by 1000 to convert to kilowatts, multiplying by a cost per kilowatt to provide an incremental cost of said energy during each said fixed period of time, and adding the incremental cost of the energy during each said fixed period of time to a cost so far accumulated to thereby provide a present accumulated cost for the energy being consumed; and said means for performing calculations further providing for multiplying said amount of watts consumed during each said fixed period of time by the number of said fixed periods of time in an hour, dividing by 1000 to convert to kilowatts and multiplying by a cost per kilowatt to thereby express a cost rate at which energy is being consumed each said fixed period of time in cost per hour; and a display means;

said microprocessor including means for continually updating said display means each said fixed period of time to display said present accumulated cost and said cost per hour rate at which energy is being consumed in the home each said fixed period of time.

3. A system for displaying on a real time basis the watt per hour rate of the consumption of electrical energy in a home, said system comprising:

a rotating disk within an electric meter having a circular array of on the order of 200 equally spaced marks thereon, each said mark representing a fixed increment of watts;

means for optically sensing the marks on said rotating disk and applying high frequency electrical signals corresponding to each mark on a.c. supply lines within the home;

means for receiving said high frequency electrical signals from said a.c. supply lines and providing digital meter pulses;

a timing source providing digital time pulses representative of real time;

a microprocessor means including a first counter means for counting said digital meter pulses and a second counter means for counting said digital time pulses to define successive fixed periods of time, each of said fixed periods of time being on the order of 5 seconds in duration;

said microprocessor means including means for multiplying the number of digital meter pulses counted in the first counter means during each of said fixed periods of time by the increment of watts represented by each of the marks on said rotating disk, and multiplying by the number of said fixed time periods in an hour to provide the real time watts per hour rate at which electrical energy is being consumed in the home; and a display means;

said microprocessor means including means for continually updating said display means each of said fixed periods of time to display said real time watts per hour.

4. A system for displaying on a real time basis the cost per hour rate at which electrical energy is being consumed in a home, said system comprising:

a rotating disk within an electric meter having on the order of 200 equally spaced marks thereon, each said mark representing a fixed increment of watts;

means for sensing the marks on said rotating disk and generating meter pulses at a rate which is a measure of the power being consumed;

a transmitter means operable in response to said meter pulses to provide high frequency electrical signals on a.c. supply lines within the home; and a portable unit including:

a microprocessor means;

a receiver means capable of being connected to said a.c. supply lines and tuned to receive said high frequency electrical signals and provide digital meter pulses;

a timing source for providing digital time pulses representative of real time;

said microprocessor means including a first counter means for counting said digital meter pulses, a second counter means for counting said digital time pulses to provide successive 5 second periods of time, and means for performing calculations on the number of digital meter pulses counted by said first counter means each time said second counter means defines a 5 second period of time, said calculator means providing for multiplying the number of meter pulses counted in the first counter means during each 5 second period of time as defined by said second counter means by the increment of watts represented by each of said meter pulses, multiplying by 720 which is the number of 5 second time periods in an hour, dividing by 1000 to convert to kilowatts, and multiplying by a rate per kilowatt to provide a real time cost per hour rate at which energy is being consumed in the home; and a display means;

said microprocessor means including means for updating said display means with said real time cost per hour rate as calculated each said 5 second period of time whereby the home consumer is kept informed of any changes in the real time cost per hour rate of energy consumption in the home.

5. A system associated with an electric meter for displaying real time data for a consumer regarding consumption of electricity for a special use in a home having a.c. supply lines with a plurality of outlets, said system comprising:

a detector means for sensing on the order of 200 equally spaced marks on the circumference of a surface of a rotating disk within said electric meter and for generating meter signals corresponding thereto;

means for applying said meter signals as high frequency electrical signals on the a.c. supply lines;

means capable of being plugged into any outlet of said a.c. supply lines for receiving said high frequency signals and generating digital meter pulses;

a clock means for generating digital time pulses representative of real time;

a microprocessor means including a first counting means for counting said digital meter pulses and a second counting means for counting said digital time pulses to define successive fixed time periods, each fixed time period being on the order of 5 seconds in duration;

a display selector for controlling data being displayed by said microprocessor means on said display means and including a total use display setting and a special use display setting;

said display selector when being set to the total use display setting controlling said microprocessor means to count the digital meter pulses received in a fixed time period when consumption of electricity is stabilized on the a.c. supply lines and to calculate and store an amount of watts corresponding to said stabilized consumption during said fixed time period;

said microprocessor means being thereafter responsive to said display selector being set to the special use display setting and starting with a first fixed time period that the specal use begins to count the digital meter pulses received during each fixed time period to calculate an amount of increment of watts represented thereby and subtract the stored amount of watts corresponding to said stabilized consumption for a fixed time period, thereby providing only an amount of watts consumed by said special use during each said fixed time period; and said microprocessor means responsive to the amount of watts used by the special use during each said fixed time period to calculate the incremental cost of the electricity and add it to a previous cost so far accumulated to obtain a real time specific cost and to further calculate a real time watts per hour usage of said special use; and a display means;

said microprocessor means including means to update the display of said real time specific cost and real time watts per hour usage on said display means each said fixed time period whereby the consumer is kept informed of the specific cost and the real time watts per hour rate of the electricity being consumed during said special use.

6. A system associated with an electric meter for displaying real time data for a consumer as defined in claim 5 wherein said special use is the measuring of the consumption of electricity by an appliance which is turned on after said display selector is set in the special use display setting.

7. A system associated with an electric meter for displaying real time data for a consumer as defined in claim 5 wherein said special use is the measuring of the consumption of electricity in the home during a given interval of time that the display selector is set in the special use display setting.

8. A system associated with an electric meter for displaying real time data relating to the usage of electrical energy being consumed in a home, said system comprising:

a rotating disk within said electric meter having a circular array of on the order of 200 equally spaced marks thereon, each mark representing a fixed increment of watts;

means for optically sensing the marks on said rotating disk and applying high frequency pulses corresponding to each mark on a.c. supply lines in the home; and a portable unit including:

a microprocessor means;

means for receiving said high frequency pulses from said a.c. supply lines and providing digital meter pulses;

a timing source providing digital time pulses representative of real time;

said microprocessor means including a first counter means for counting said digital meter pulses and a second counter means for counting said digital time pulses to provide fixed periods of time, each fixed period of time being on the order of 5 seconds in duration;

said microprocessor means including means to perform calculations on a number of digital meter pulses counted by the first counter means each time the second counter means defines a fixed period of time by multiplying said number of digital meter pulses by the increment of watts represented by each meter pulse to thereby provide the incremental amount of watts consumed during each said fixed period of time, and multiplying said incremental amount of watts consumed by the number of said fixed periods of time in an hour, to thereby express the usage rate at which energy is being consumed each said fixed period of time in watts per hour;

a display means;

said microprocessor means providing for continually updating said display means each said fixed period of time to display the watts per hour rate at which energy is being consumed in the home during each said fixed period of time;

wherein said electric meter may be any of a number of different meter types, each meter type having one revolution of its disk and therefore each mark sensed from the surface thereof corresponding to a different amount of watts, and wherein said microprocessor means stores the amount of watts corresponding to one revolution of the disk for each of said number of different meter types; and external means for adapting said microprocessor means to be set to perform calculations with each meter pulse sensed from the rotating disk equal to the amount of watts corresponding to one revolution of the disk for the meter type being used divided by the number of equally spaced marks provided on said disk.

9. A method for displaying data to enable a consumer to know on a real time basis the watts per hour rate of consumption of electrical energy in a home comprising the steps of:
provided an electrical meter having a rotating disk therein with a circular array of on the order of 200 equally spaced marks thereon, said electric meter having a watts rating equivalent to the amount of watts usage represented by one rotation of said disk;
optically sensing the marks on said rotating disk to provide a series of meter pulses;
applying high frequency electrical signals corresponding to each meter pulse on a.c. supply lines within the home;
receiving said high frequency electrical signals from said a.c. supply lines and generating a digital meter pulse for each of said high frequency electrical signals;
counting said digital meter pulses as they appear;
providing a time source supplying digital time pulses representative of real time;
counting said digital time pulses as they appear to define successive fixed periods of time, each of said fixed periods of time being on the order of 5 seconds in duration;
performing calculations at the end of each of said fixed periods of time by multiplying the count of said digital meter pulses during each of said fixed periods of time by a quotient obtained by dividing the watts rating of said electric meter by the number of marks on said disk and multiplying by the number of said fixed periods of time in an hour to provide a real time watts per hour rate at which energy is being consumed in the home; and
continually updating a display means each of said fixed periods of time to display said real time watts per hour rate.

10. A method for informing a home consumer as to the real time rate of usage of power in a home comprising:
sensing on the order to 200 equally spaced calibration marks provided on the surface of a rotating disk within an electric meter to provide a series of meter pulses, each meter pulse appearing in the series of meter pulses at a rate corresponding to a measure of the power consumption at that instant, each meter pulse representing a fixed amount of watts;
applying said series of meter pulses as high frequency signals on a.c. supply lines within the home;
receiving said high frequency signals from the a.c. supply lines and generating digital meter pulses corresponding thereto;
feeding said digital meter pulses to a microprocessor for counting;
providing a time source for generating digital time pulses representative of real time;
feeding said digital time pulses to the microprocessor for counting to define fixed time periods which are on the order of 5 seconds in duration;
performing math in the microprocessor by multiplying the number of digital meter pulses counted each of said fixed time periods by the increment of watts represented by each meter pulse, and by further multiplying by the number of said fixed time periods in an hour to thereby provide digital data representing a watts per hour rate during each of said fixed time periods which is essentially the rate at which the meter pulses appear in the series of meter pulses being sensed from the rotating disk of the electric meter during each of said fixed time periods; and
continuously updating a display means each of said fixed time periods with the digital data representing the watts per hour rate;
whereby a home consumer is able to be kept informed on a real time basis of the watts per hour usage of the consumption of electrical energy in the home.

* * * * *